(12) United States Patent
Retz et al.

(10) Patent No.: US 9,853,608 B2
(45) Date of Patent: Dec. 26, 2017

(54) TEMPERATURE COMPENSATION TECHNIQUE FOR ENVELOPE TRACKING SYSTEM

(71) Applicant: RF Micro Devices, Inc., Greensboro, NC (US)

(72) Inventors: James M. Retz, Cedar Rapids, IA (US); Jeff Kaminski, Cedar Rapids, IA (US)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 15/079,204

(22) Filed: Mar. 24, 2016

(65) Prior Publication Data
US 2016/0373071 A1    Dec. 22, 2016

Related U.S. Application Data

(60) Provisional application No. 62/181,804, filed on Jun. 19, 2015.

(51) Int. Cl.
| | |
|---|---|
| *H04B 1/04* | (2006.01) |
| *H03F 1/30* | (2006.01) |
| *H03F 3/19* | (2006.01) |
| *H03F 3/21* | (2006.01) |
| *H03G 3/30* | (2006.01) |

(Continued)

(52) U.S. Cl.
CPC .......... *H03F 1/30* (2013.01); *H03F 1/0227* (2013.01); *H03F 1/0233* (2013.01); *H03F 3/19* (2013.01); *H03F 3/21* (2013.01); *H03F 3/245* (2013.01); *H03G 3/3042* (2013.01); *H04B 1/0475* (2013.01); *H03F 2200/105* (2013.01); *H03F 2200/336* (2013.01); *H03F 2200/447* (2013.01);

(Continued)

(58) Field of Classification Search
CPC ..... H03F 1/30; H03F 3/19; H03F 3/21; H03F 2200/105; H03F 2200/447; H03F 2200/451; H03G 3/3042; H04B 1/0475; H04B 2001/0425; H04B 2001/0416
USPC ................ 375/259, 260, 285, 295, 296, 297
See application file for complete search history.

(56) References Cited

U.S. PATENT DOCUMENTS

| | | | |
|---|---|---|---|
| 7,433,658 B1 * | 10/2008 | Shirvani-Mahdavi | H03G 3/3042 455/115.1 |
| 8,782,107 B2 | 7/2014 | Myara et al. | |

(Continued)

FOREIGN PATENT DOCUMENTS

JP        405075352 A  *  3/1993   ............. H03F 1/30

*Primary Examiner* — Siu Lee
(74) *Attorney, Agent, or Firm* — Withrow & Terranova, P.L.L.C.

(57) ABSTRACT

Disclosed is an envelope tracking (ET) system having a transmit (TX) section, a power amplifier (PA), a fast switched-mode power supply (Fast SMPS), and control circuitry. The TX section receives an input signal and provides a modulated signal to the PA. The TX section also generates an ET signal based on a modulation envelope of the modulated signal. The TX section provides an envelope control (EC) signal based on the ET signal to modulate a supply signal provided to the PA by the Fast SMPS. The control circuitry provides a transmit TX gain signal and an ET gain signal to the TX section based on a PA temperature signal, a TX temperature signal, a target power signal, a measured power signal. The control circuitry is configured to maintain the efficiency and linearity of the PA over a wide operating temperature range.

17 Claims, 1 Drawing Sheet

(51) Int. Cl.
*H03F 1/02* (2006.01)
*H03F 3/24* (2006.01)

(52) U.S. Cl.
CPC .............. *H03F 2200/451* (2013.01); *H04B 2001/0416* (2013.01); *H04B 2001/0425* (2013.01)

(56) References Cited

U.S. PATENT DOCUMENTS

| | | |
|---|---|---|
| 9,075,673 B2 | 7/2015 | Khlat et al. |
| 2004/0137852 A1* | 7/2004 | Shi ................ H03G 3/3042 455/73 |
| 2006/0030359 A1* | 2/2006 | Behzad ............. H03F 1/0205 455/556.1 |
| 2012/0119813 A1* | 5/2012 | Khlat .................. G06F 7/556 327/350 |
| 2012/0146730 A1* | 6/2012 | Signoff ................. H03F 1/30 330/279 |
| 2014/0028402 A1* | 1/2014 | An .................... H03F 1/0244 330/296 |
| 2014/0057684 A1* | 2/2014 | Khlat ............. H04W 52/0209 455/574 |
| 2014/0111275 A1* | 4/2014 | Khlat .................... H03F 3/24 330/124 R |
| 2014/0184334 A1* | 7/2014 | Nobbe ............... H03F 1/0227 330/291 |
| 2015/0071382 A1* | 3/2015 | Wu ....................... H03F 1/30 375/297 |
| 2015/0123733 A1* | 5/2015 | Wimpenny .......... H03F 1/0227 330/279 |

* cited by examiner

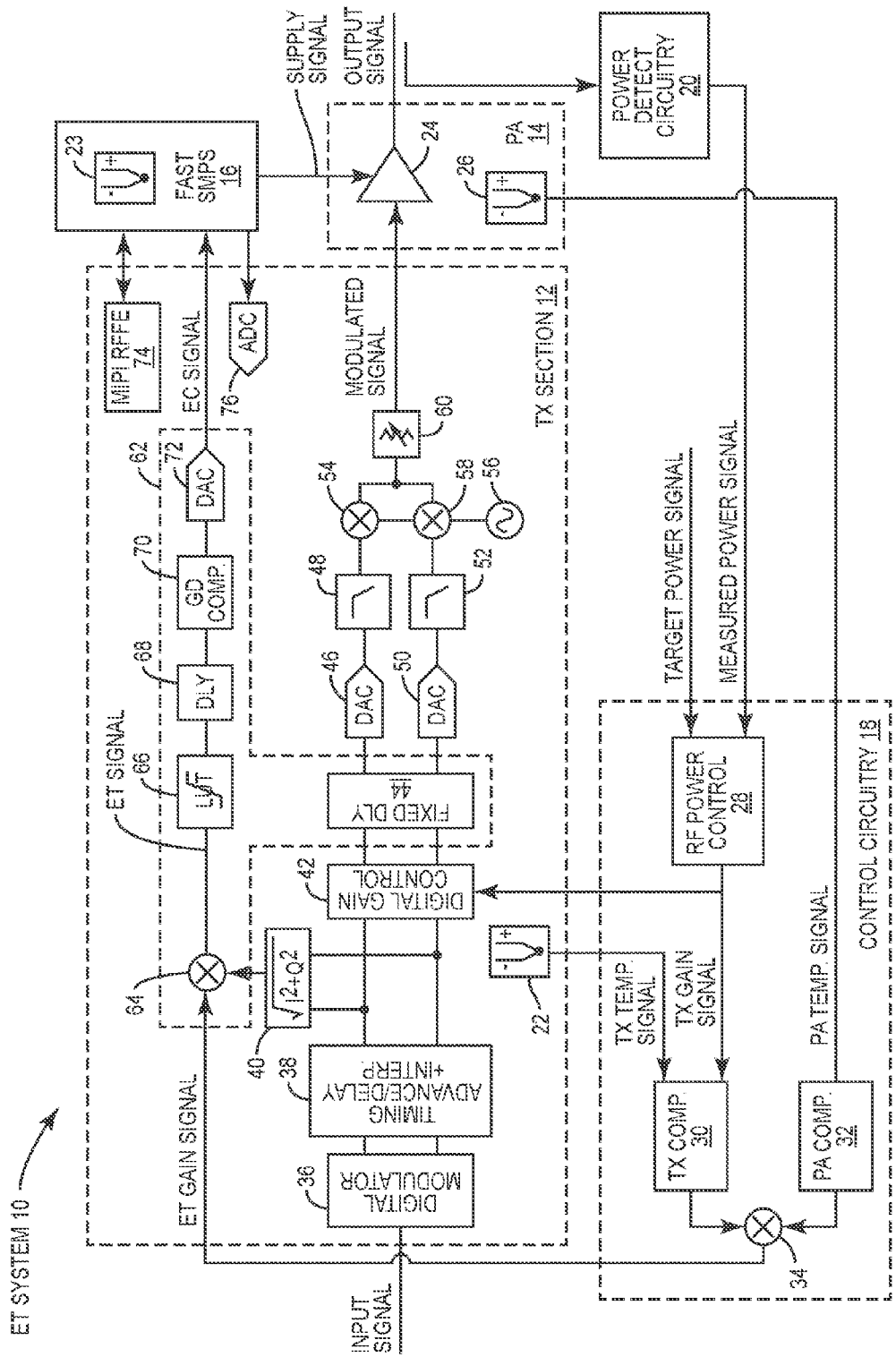

TEMPERATURE COMPENSATION TECHNIQUE FOR ENVELOPE TRACKING SYSTEM

RELATED APPLICATIONS

This application claims the benefit of U.S. provisional patent application No. 62/181,804, filed Jun. 19, 2015, the disclosure of which is incorporated herein by reference in its entirety.

FIELD OF THE DISCLOSURE

The present disclosure relates to temperature compensation of envelope tracking systems for modulating supply power of radio frequency power amplifiers.

BACKGROUND

Many modern electronic devices include wireless communications circuitry. For example, an electronic device may include wireless local area network (WLAN) circuitry, cellular communications circuitry, or the like. While wireless communications circuitry allows electronic devices to communicate with one another, such functionality generally comes at the cost of additional energy consumption and thus reduced battery life. As wireless communications protocols evolve to provide higher speeds, energy consumption of wireless communications circuitry often increases to meet the higher demands of such protocols. Often the transmit power amplifier (PA) within the wireless communications circuitry is the largest consumer of energy in an electronics device.

For example, the WLAN 802.11 standards and the cellular Long Term Evolution (LTE) standards use orthogonal frequency division multiple access (OFDMA) for wireless transmissions. These OFDMA wireless transmissions have a high peak to average power ratio (PAPR). When a PA using a fixed supply signal amplifies a modulated signal having a high PAPR, the PA efficiency may be greatly reduced. Envelope tracking may be used to increase the efficiency by modulating the supply signal to the PA based on the modulation envelope of the modulated signal. A look-up-table (LUT) may be populated with values during factory calibration to shape the magnitude of supply signal modulation versus input power to the PA. As temperature varies, the PA characteristics may change resulting in non-linear distortion and/or reduced PA efficiency from using supply signal modulation based on factory calibration LUT values.

SUMMARY

The present disclosure provides an envelope tracking (ET) system comprising a transmit (TX) section, a power amplifier (PA), a fast switched-mode power supply (Fast SMPS), and control circuitry. The TX section is configured to modulate an input signal and provide a modulated signal to an input of the PA. The input signal may be a digital signal. The TX section also provides an envelope control (EC) signal based on an ET signal and an ET gain signal. The EC signal controls a supply signal provided to the PA by the Fast SMPS. The control circuitry is configured to provide the ET gain signal based on a PA temperature signal, a TX temperature signal, a measured power signal, and a target power signal. The ET gain signal may be a digital signal.

The PA temperature signal is indicative of a temperature of the PA and may be derived from at least one of a PA temperature sensor, a Fast SMPS temperature sensor, and a TX temperature sensor. The TX temperature signal is indicative of a temperature of the TX section and may be derived from at least one of the PA temperature sensor, the Fast SMPS temperature sensor, and the TX temperature sensor. The measured power signal is indicative of an output power of an output signal from the PA and the target power signal is indicative of a desired power for the output signal.

The ET signal is digital signal indicative of a modulation envelope of the modulated signal and is derived from a digital in-phase (I) signal and a digital quadrature (Q) signal. The ET signal may be provided by a coordinate rotational digital computer (CORDIC) configured to receive the digital I signal and the digital Q signal. An ET signal magnitude is controlled by the ET gain signal using a multiplier. The ET gain signal is coupled to the multiplier, and the multiplier may convert the ET gain signal from a logarithmic scale to a linear scale. The ET signal is coupled to an input of a look-up-table (LUT) and the EC signal is derived from an output of the LUT.

The control circuitry may decrease a magnitude of the ET gain signal with an increase in a magnitude of the PA temperature signal and increase the magnitude of the ET gain signal with a decrease in the magnitude of the PA temperature signal. In some embodiments the control circuitry decreases the magnitude of the ET gain signal between approximately 0.001 decibels per degrees Celsius (dB/° C.) and approximately 0.1 dB/° C. per increase in the magnitude of the PA temperature signal. In other embodiments, the control circuitry decreases the magnitude of the ET gain signal between approximately 0.02 dB/° C. and approximately 0.05 dB/° C. per increase in the magnitude of the PA temperature signal.

The control circuitry also provides a TX gain signal to the TX section based on the measured power signal and the target power signal. The TX section varies a magnitude of the modulated signal based on the TX gain signal. The control circuitry increases the magnitude of the TX gain signal when a magnitude of the measured power signal is less than a magnitude of the target power signal, and decreases the magnitude of the TX gain signal when the magnitude of the measured power signal is greater than the magnitude of the target power signal. The TX gain signal may be a digital signal. Additional features of the TX section include delaying the modulated signal based on a response time of the Fast SMPS.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this Specification illustrate several aspects of the disclosure, and together with the description serve to explain the principles of the disclosure.

FIG. 1 is a block diagram of an envelope tracking (ET) system that incorporates temperature compensation for envelope tracking.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

FIG. 1 is a block diagram of an envelope tracking (ET) system 10 that is useful in illustrating the concepts of the present disclosure. The ET system 10 comprises a transmit (TX) section 12, a power amplifier (PA) 14, a fast switched-mode power supply (Fast SMPS) 16, control circuitry 18, and power detect circuitry 20. In one embodiment, the ET system 10 is incorporated into a wireless mobile device (not shown) for transmitting orthogonal frequency division multiple access (OFDMA) wireless signals.

The TX section 12 is configured to receive an input signal, modulate the input signal, and provide a modulated signal to an input of the PA 14. The TX section 12 is further configured to receive a TX gain signal from the control circuitry 18 and adjust a magnitude of the modulated signal based on a magnitude of the TX gain signal. The TX section 12 also provides an envelope control (EC) signal to the Fast SMPS 16 to modulate a supply signal to the PA 14. In some embodiments, the Fast SMPS 16 may modulate a plurality of supply signals (not shown) to the PA 14. The EC signal is based on an ET signal and an ET gain signal. The ET signal is derived from the modulated signal and matches a modulation envelope of the modulated signal. The ET gain signal is received from the control circuitry 18 and is configured to adjust a gain of the ET signal. The TX section 12 may incorporate a TX temperature sensor 22 that is used to derive a TX temperature signal for the control circuitry 18. In some embodiments, the TX temperature sensor 22 may be a thermocouple. In other embodiments, the Fast SMPS 16 may incorporate a Fast SMPS temperature sensor 23 that is used to derive a TX temperature signal for the control circuitry 18. In some embodiments, the Fast SMPS temperature sensor 23 may be a thermocouple.

The PA 14 is configured to receive the modulated signal and provide an output signal via amplifier circuitry 24. The amplifier circuitry 24 may include one amplifier stage or a plurality of cascaded amplifier stages (not shown). In some embodiments, amplifier circuitry 24 may include a pre-driver stage, a driver stage, and an output amplifier stage. The amplifier circuitry 24 is configured to receive the supply signal from the Fast SMPS 16. The PA 14 may incorporate a PA temperature sensor 26 that is used to derive a PA temperature signal for the control circuitry 18. In some embodiments, the PA temperature sensor 26 may be a thermocouple.

In some embodiments, the output signal may be directly coupled to a TX antenna (not shown) with a transmission line. In other embodiments, the output signal may be coupled with an RF front end module (not shown) that passes the output signal through selectable filters to the TX antenna via RF switches. In other embodiments, the output signal may be coupled with impedance matching circuitry (not shown).

The control circuitry 18 comprises an RF power control function 28, a TX compensation function 30, a PA compensation function 32, and a multiplier 34. The control circuitry 18 is configured to receive a target power signal, a measured power signal, the TX temperature signal, and the PA temperature signal. In some embodiments, the received signals are digital signals. In other embodiments, one or more of the received signals may be analog signals. The control circuitry 18 may be implemented in hardware, software, or a combination thereof. In some embodiments control circuitry 18 may be implemented within a module or circuitry associated with the TX section 12, the PA 14, the Fast SMPS 16, or a combination thereof.

The target power signal may be based on a transmit power requirement of the wireless mobile device. The transmit power requirement may be for a specific mode of operation for OFDMA wireless transmission. The measured power signal is proportional to an output power of the output signal. Power detect circuitry 20 may be directly or indirectly coupled to the output signal and provides the measured power signal to the control circuitry 18.

The TX temperature signal may be derived from the TX temperature sensor 22. In other embodiments, the TX temperature signal may be derived from the PA temperature sensor 26, the Fast SMPS temperature sensor 23, or another mobile device temperature sensor (not shown). The PA temperature signal may be derived by the PA temperature sensor 26. In other embodiments, the PA temperature signal may be derived from the TX temperature sensor 22, the Fast SMPS temperature sensor 23, or the other mobile device temperature sensor.

The RF power control function 28 is configured to vary the magnitude of the TX gain signal in a closed loop fashion, such that the measured power signal is approximately equal to the target power signal. For example, a gain of the PA 14 may be reduced with an increase in temperature of the PA, thus resulting in a decrease of the magnitude of the output signal. The RF power control function 28 responds with an increase in the magnitude of the TX gain signal resulting in an increase in the magnitude of the modulated signal.

The control circuitry 18 includes a TX compensation function 30 and a PA compensation function 32 coupled to a multiplier 34. The multiplier 34 provides the ET gain signal to the TX section 12 and allows the TX compensation function 30 and the PA compensation function 32 to independently vary the magnitude of the ET gain signal. The multiplier 34 may provide the ET gain signal based on a logarithmic scale or a linear scale. The multiplier 34 may provide digital linear gain to digital log gain conversion for the ET gain signal.

The TX compensation function 30 varies the magnitude of the ET gain signal based on the TX temperature signal and the TX gain signal. The TX compensation function 30 emulates variations that may occur in the magnitude of the modulated signal within the TX section 12 due to the RF power control function 28 and analog gain variations due to temperature.

The PA compensation function 32 varies the magnitude of the ET gain signal based on the PA temperature signal. The PA compensation function 32 may decrease a magnitude of the ET gain signal with an increase in a magnitude of the PA temperature signal and increase the magnitude of the ET gain signal with a decrease in the magnitude of the PA temperature signal.

A temperature coefficient of the PA compensation function 32 may be selected to maintain linearization of the PA 14 over a PA temperature range of approximately −20 degrees Celsius (° C.) to approximately +85° C. In other embodiments, the temperature coefficient may be selected to maintain constant gain of the PA 14 over a PA temperature range of approximately −40 degrees Celsius (° C.) to approximately +110° C. In some embodiments, the temperature coefficient decreases the magnitude of the ET gain signal between approximately 0.001 decibels per degrees Celsius (dB/° C.) and approximately 0.1 dB/° C. per increase in the magnitude of the PA temperature signal. In other embodiments, the temperature coefficient decreases the magnitude of the ET gain signal between approximately 0.02 dB/° C. and approximately 0.05 dB/° C. per increase in the magnitude of the PA temperature signal. In some embodiments, the temperature coefficient may be selected to minimize a spectrum emission mask (SEM), amplitude-to-amplitude modulation (AMAM) distortion, amplitude-to-phase modulation (AM/PM) distortion, adjacent-channel leakage (ACL), error vector magnitude (EVM), or a combination thereof. In other embodiments, the temperature coefficient may be selected based on a desired frequency response.

The control circuitry 18 may be implemented in hardware, software, or a combination thereof. In some embodiments, control circuitry 18 may be implemented within a module or circuitry associated with the TX section 12, the PA 14, the Fast SMPS 16, or a combination thereof.

The TX section 12 is further configured to include a digital modulator 36 that modulates the input signal into an in-phase (I) signal and a quadrature (Q) signal based on a modulation format. In some embodiments, the input signal may be a digital bit stream. Modulation formats include amplitude modulation (AM), frequency modulation (FM), and phase modulation (PM). Modulation formats may also include combinations of AM, FM, and PM. In some embodiments, modulation formats may include one or more quadrature amplitude modulation (QAM) formats having combinations AM and PM.

A timing function 38 may provide timing advances and delays for the I and Q signals. In some embodiments, the advances and delays may be in response to a request from a cellular base station communicating with the wireless mobile device. The timing function 38 may also provide data sample interpolation for achieving higher data sample rates of the I and Q signals. In some embodiments, the timing function 38 may double the data sample rates of the I and Q signals, and provide digital filtering with the data sample interpolation. The higher data sample rates with digital filtering may reduce analog reconstruction filtering requirements for digital to analog conversion of the I and Q signals. In other embodiments, the timing function 38 may increase sampling rates by three or by six times.

Envelope detection circuitry 40 generates the ET signal by calculating a magnitude of the I and Q signals. In some embodiments, the envelope detection circuitry 40 may be implemented using a coordinate rotation digital computer (CORDIC). The CORDIC may be configured as shown in FIG. 2 of U.S. Pat. No. 8,782,107, entitled "DIGITAL FAST CORDIC FOR ENVELOPE TRACKING GENERATION," which is herein incorporated by reference. In other embodiments, the CORDIC may be configured as shown in FIG. 3 of U.S. Pat. No. 8,782,107, entitled "DIGITAL FAST CORDIC FOR ENVELOPE TRACKING GENERATION."

A digital gain control 42 provides gain to the I and Q signals based on the TX gain signal. The TX gain signal may be a digital signal. The digital gain control 42 may be used to adjust a magnitude of the modulated signal provided to the input of the PA 14. In at least one embodiment, the TX gain signal may be based on a logarithmic scale. In this embodiment, the digital gain control 42 comprises one digital log gain to digital linear gain multiplier (not shown) for providing gain to the I signal. Another digital log to digital linear gain multiplier (not shown) is included for providing gain to the Q signal. The digital log to digital linear gain multipliers may be configured as shown in FIG. 2 of U.S. Pat. No. 9,075,673, entitled "DIGITAL FAST DB TO GAIN MULTIPLIER FOR ENVELOPE TRACKING SYSTEMS," which is herein incorporated by reference. In other embodiments, the digital log to digital linear gain multipliers may be configured as shown in FIG. 3 of U.S. Pat. No. 9,075,673, entitled "DIGITAL FAST DB TO GAIN MULTIPLIER FOR ENVELOPE TRACKING SYSTEMS."

A fixed delay 44 provides a digital delay of the I and Q signals before a digital-to-analog conversion. The fixed delay 44 may be selected to match ET delays and an average modulation response time of the Fast SMPS 16, wherein the Fast SMPS 16 is configured to modulate a supply signal of the PA 14.

A first digital-to-analog converter (DAC) 46 converts the digital I signal into an analog I signal that is filtered by a first reconstruction filter 48. Similarly, a second DAC 50 converts the digital Q signal into an analog Q signal that is filtered by a second reconstruction filter 52.

A first mixer 54 mixes the analog I signal with an RF signal generated by an RF oscillator 56. A second mixer 58 mixes the analog Q signal with the RF signal. Mixed outputs from the first mixer 54 and the second mixer 58 combine to produce the modulated signal. A variable attenuator 60 may be used in cooperation with the TX gain signal to further adjust the gain of the modulated signal.

The TX section 12 also includes an envelope control (EC) signal generator 62 that is configured to modulate the Fast SMPS 16 based on the ET signal. The EC signal generator 62 includes a gain multiplier 64 that varies the gain of the ET signal based on an ET gain signal received from the control circuitry 18. In at least one embodiment, the ET gain signal may be based on a logarithmic scale. In this embodiment, the gain multiplier 64 provides digital log gain to digital linear gain and may be configured as shown in FIG. 2 of U.S. Pat. No. 9,075,673, entitled "DIGITAL FAST DB TO GAIN MULTIPLIER FOR ENVELOPE TRACKING SYSTEMS." In other embodiments, the multiplier 34 may be configured as shown in FIG. 3 of U.S. Pat. No. 9,075,673, entitled "DIGITAL FAST DB TO GAIN MULTIPLIER FOR ENVELOPE TRACKING SYSTEMS."

After gain is applied, the ET signal drives an input to a look-up-table (LUT) 66. An output of the LUT 66 provides the EC signal. The EC signal is shaped by the LUT 66 such that the EC signal modulates the supply signal in a fashion to give a nearly constant gain of the PA 14 versus a wide range of power levels of the input signal. The LUT 66 is calibrated at a known temperature to match characteristics of the Fast SMPS 16 and the PA 14 to achieve a constant gain of the PA 14. In some embodiments, the LUT 66 may limit the EC signal to a minimum value when the power level of the input signal is below a minimum threshold value. The LUT 66 may also limit the EC signal to a maximum value when the power level of the input signal is above a maximum threshold value.

A programmable delay 68 is used to finely tune synchronization between the EC signal and the modulated signal. In some embodiments, the programmable delay 68 may be between approximately −10 nanoseconds and approximately +10 nanoseconds A group delay compensator 70 is included to compensate for a dynamic bandwidth response of the Fast SMPS 16. The EC signal generator 62 has a third DAC 72 for converting the EC signal into an analog signal that drives the Fast SMPS 16 to modulate the supply signal to the PA 14. A reconstruction filter (not shown) may be positioned after the third DAC 72 to provide low pass filtering to the EC signal. In another embodiment, the EC signal may be a differential signal (not shown).

In some embodiments, the TX section 12 may monitor the Fast SMPS temperature sensor 23 and control the Fast SMPS 16 through a mobile industry processor interface (MIPI) RF front-end (RFFE) standard interface 74. A general purpose analog-to-digital converter (ADC) 76 may monitor the supply signal provided to the PA 14 by the Fast SMPS 16.

Those skilled in the art will recognize improvements and modifications to the embodiments of the present disclosure. All such improvements and modifications are considered within the scope of the concepts disclosed herein and the claims that follow.

What is claimed is:

1. An envelope tracking (ET) system comprising:
   a transmit (TX) section configured to:
      modulate an input signal and provide a modulated signal to an input of a power amplifier (PA); and
      provide an envelope control (EC) signal based on an ET gain signal, wherein the EC signal controls a supply signal provided to the PA; and
   control circuitry configured to:
      receive a PA temperature signal indicative of a temperature of the PA, a measured power signal indicative of an output power of an output signal from the PA, and a TX temperature signal indicative of a temperature of the TX section;
      generate a TX gain signal based on the measured power signal; and
      adjust the TX gain signal based on the PA temperature signal and the TX temperature signal to provide the ET gain signal, wherein the TX gain signal is independently adjusted based on the PA temperature signal and the TX temperature signal.

2. The ET system of claim 1 wherein the control circuitry is further configured to receive a target power signal indicative of a desired power for the output signal and the TX gain signal is further based on the target power signal.

3. The ET system of claim 1 wherein the PA temperature signal is derived from at least one of a PA temperature sensor, a Fast SMPS temperature sensor, and a TX temperature sensor.

4. The ET system of claim 2 wherein the EC signal is further based on an ET signal that is indicative of a modulation envelope of the modulated signal and the ET signal is controlled by the ET gain signal.

5. The ET system of claim 4 wherein the ET signal is a digital signal provided to an input of a look-up-table (LUT) and the EC signal is derived from an output of the LUT.

6. The ET system of claim 5 wherein the ET signal is derived from a digital in-phase (I) signal and a digital quadrature (Q) signal.

7. The ET system of claim 6 wherein the control circuitry decreases a magnitude of the ET gain signal with an increase in a magnitude of the PA temperature signal and increases the magnitude of the ET gain signal with a decrease in the magnitude of the PA temperature signal.

8. The ET system of claim 6 wherein the control circuitry decreases a magnitude of the ET gain signal between approximately 0.001 decibels per degrees Celsius (dB/° C.) and approximately 0.1 dB/° C. per increase in a magnitude of the PA temperature signal.

9. The ET system of claim 6 wherein the control circuitry decreases a magnitude of the ET gain signal between approximately 0.02 decibels per degrees Celsius (dB/° C.) and approximately 0.05 dB/° C. per increase in a magnitude of the PA temperature signal.

10. The ET system of claim 7 wherein the control circuity is further configured to provide the TX gain signal based on the measured power signal and the target power signal, and the TX section is further configured to vary the magnitude of the modulated signal based on the TX gain signal.

11. The ET system of claim 10 wherein the control circuitry is further configured to increase a magnitude of the TX gain signal when a magnitude of the measured power signal is less than a magnitude of the target power signal, and decrease the magnitude of the TX gain signal when the magnitude of the measured power signal is greater than the magnitude of the target power signal.

12. The ET system of claim 11 further comprising a fast switched-mode power supply (Fast SMPS), the Fast SMPS configured to receive the EC signal and provide the supply signal to the PA.

13. The ET system of claim 12 wherein the TX section is further configured to delay the modulated signal based on a response time of the Fast SMPS.

14. The ET system of claim 13 wherein the input signal, the ET gain signal, and the TX gain signal are digital signals.

15. The ET system of claim 14 wherein the ET signal is provided by a coordinate rotational digital computer (CORDIC) configured to receive the digital I signal and the digital Q signal.

16. The ET system of claim 15 wherein the magnitude of the ET signal is controlled by a multiplier, the ET gain signal is coupled to the multiplier, and the multiplier is configured to the ET gain signal from a logarithmic scale to a linear scale.

17. A method of controlling an envelope tracking (ET) system having a transmit (TX) section coupled with a power amplifier (PA), the method comprising:
   receiving a target power signal indicative of a desired power of an output signal from a power amplifier (PA);
   receiving a measured power signal indicative of an output power of the output signal;
   receiving a PA temperature signal indicative of a temperature of the PA;
   receiving a TX temperature signal indicative of a temperature of the TX section, wherein the TX section provides a modulated signal to an input of the PA;
   providing a TX gain signal configured to vary a magnitude of the modulated signal, wherein the TX gain signal is based on the target power signal and the measured power signal; and
   adjusting the TX gain signal based on the PA temperature signal and the TX temperature signal to provide an ET gain signal, wherein the TX gain signal is independently adjusted based on the PA temperature signal and the TX temperature signal.

* * * * *